United States Patent
Cranford et al.

(10) Patent No.: US 7,332,932 B2
(45) Date of Patent: Feb. 19, 2008

(54) SERIAL LINK RECEIVER WITH WIDE INPUT VOLTAGE RANGE AND TOLERANCE TO HIGH POWER VOLTAGE SUPPLY

(75) Inventors: Hayden C. Cranford, Cary, NC (US); Westerfield J. Ficken, Cary, NC (US); David A. Freitas, Morgan Hill, CA (US); Joseph M. Stevens, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 11/417,626

(22) Filed: May 4, 2006

(65) Prior Publication Data

US 2008/0012642 A1   Jan. 17, 2008

(51) Int. Cl.
*H03K 17/16* (2006.01)
*H03K 19/003* (2006.01)
*H03K 19/0175* (2006.01)

(52) U.S. Cl. .................... 326/30; 326/21; 326/82; 326/95

(58) Field of Classification Search ............. 326/82, 326/112, 115, 119, 121, 127, 30, 21, 95, 98; 327/108
See application file for complete search history.

(56) References Cited

U.S. PATENT DOCUMENTS

| 5,684,429 | A  | 11/1997 | Sanwo et al. |
| 5,880,634 | A  | 3/1999  | Babanezhad |
| 5,936,445 | A  | 8/1999  | Babanezhad et al. |
| 5,977,819 | A  | 11/1999 | Sanwo et al. |
| 6,504,404 | B2 * | 1/2003 | Uchiki et al. ............ 327/65 |
| 7,061,273 | B2 * | 6/2006 | Wang et al. ............. 326/86 |

\* cited by examiner

*Primary Examiner*—Rexford Barnie
*Assistant Examiner*—Dylan White
(74) *Attorney, Agent, or Firm*—Josh G. Cockburn; Dillon & Yudell LLP

(57) ABSTRACT

A circuit device and method for designing a serial link receiver, which accommodates a wide input voltage range and provides tolerance to high termination voltages. The receiver is designed with a pair of RC networks connected inline between the input and the preamplifier and a common mode feedback loop, which monitors shifts in the common mode voltage and adjusts the inputs provided to the preamplifier. The circuit device maintains a flat bandwidth to accommodate all signaling rates.

16 Claims, 2 Drawing Sheets

SERIAL LINK RECEIVER WITH WIDE INPUT VOLTAGE RANGE AND TOLERANCE TO HIGH POWER VOLTAGE SUPPLY

BACKGROUND OF THE INVENTION

1. Technical Field

The present invention relates generally to electrical circuits and in particular to serial link receivers.

2. Description of the Related Art

High speed serial (HSS) link receivers are key components in data receiving circuits commonly utilized on/connected to on the receiving end of an electrical data transmission line. These HSS receiver, as they are frequently called, are required to accommodate a wide range of termination voltages, from 0V up to a potential exceeding the chip $V_{DD}$.

Additionally, the HSS link receiver is also required to provide certain other power characteristics for proper operation. Among these power characteristics are: (1) The HSS receiver should tolerate these wide ranges of termination voltages when the receiver is partially powered; (2) The HSS receiver should interoperate with other receiver components powered by the chip's $V_{DD}$; and (3) Power consumption of the HSS receiver should be minimized.

Other functional requirements of the receiver include: (1) The HSS receiver should present a high impedance when required; (2) The HSS receiver should function similarly over all signaling rates and transition densities; (3) The HSS receiver should reject common mode noise; and (4) The HSS receiver should operate at an optimal common mode voltage. Finally, a specific design characteristics desired of the HSS receiver is that the area of the HSS receiver should be minimized.

As described below, various receiver input networks provide partial solutions that address a few of the problems/requirements stated above; However, none of these networks address all of the problems in one solution. One conventionally implemented solution, which purports to accommodate these varying requirements for an HSS receiver, is illustrated by FIG. 1. As shown, the HSS receiver 100 comprises a pair of series-connected capacitors 114A and 114B respectively coupling the receiver's input signals 201 and 203 to the preamplifier 113. However, this solution does not function well with low signaling rates or for arbitrarily long data run lengths. Additionally, this solution occasionally requires prohibitively large amounts of area to accommodate the large capacitors.

An alternative solution powers the input network and potentially part of the receiver from the termination voltage. This solution requires much more power be supplied because all current is now drawn from a much higher voltage supply. Potentially, however, this alternative solution does not address the need to handle lower termination voltages. Also, this solution may typically have limited bandwidth. In addition, power sequencing or latchup problems may result from powering the receiver from two supplies.

Yet another alternative solution utilizes a high common mode input network in parallel with a low common mode one. The outputs of these two networks are then multiplexed together, and the final output is then sent to the receiver input. This solution requires a large amount of power in the low common mode input network and in the multiplexing stage in order to provide the necessary bandwidth. In addition, this solution potentially doubles the parasitic load seen at the input of the network and decreases the return loss margin.

SUMMARY OF THE INVENTION

Disclosed is a circuit device and method for designing a serial link receiver that accommodates a wide input voltage range and tolerance to high termination voltages. The input network (circuit device) is designed to handle a wide range of termination voltages and present an acceptable output level to the rest of the receiver. The circuit device maintains a flat bandwidth to accommodate all signaling rates, and the device requires substantially no (or a minimal) power increase from conventional designs.

The serial link receiver is composed of four primary components: the termination resistors and supply, a pair of inline resistor-capacitor (RC) networks, a common mode feedback loop, and the receiver preamplifier. The common mode feedback loop is utilized to monitor the shifted common-mode voltage and comprises an error amplifier and a pair of pull-up and pull-down current sources. For normal operation, the error amplifier in the feedback loop monitors the common mode voltage at the input of the preamplifier and triggers the current sources to source current into or sink current from the termination supply.

The direct current (DC-current) from the feedback loop flows through the resistor of the RC networks, which exhibit a high impedance compared to the termination resistors, and the DC-current flow creates a voltage drop across the RC network. The voltage drop across the RC network therefore raises or lowers the input common mode voltage, as needed. The capacitor in parallel with the resistor in each RC network couples the at-speed signal around the resistor, therefore preserving the amplitude of the at-speed signal and preventing the attenuation that would be caused if the signal traveled through the resistor. Once the feedback loop has made this adjustment, the signal at the input of the preamplifier is at the desired optimal common mode voltage.

The current in the output of the feedback loop is sized so that the common mode voltage may be shifted a sufficient amount to prevent an over voltage condition at the preamplifier input. Since the feedback loop constantly monitors the common mode voltage, any common mode noise is removed up to the bandwidth limit of the loop.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a circuit device and method for designing a serial link receiver that accommodates a wide input voltage range and tolerance to high termination voltages. The input network (circuit device) is designed to handle a wide range of termination voltages and present an acceptable output level to the rest of the receiver.

The circuit device maintains a flat bandwidth to accommodate all signaling rates, and the device requires substantially no (or a minimal) power increase from conventional designs.

Figure 1:
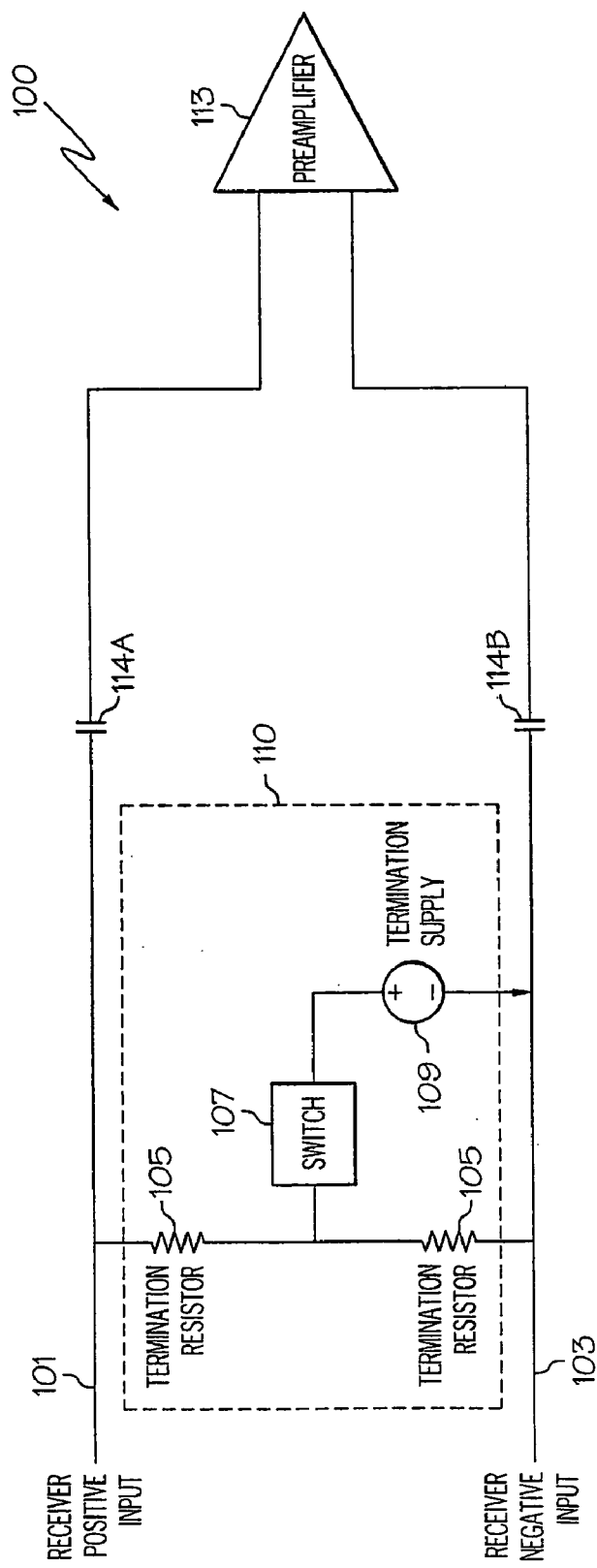
FIG. 1 is a prior art representation of an input network/HSS receiver with in line capacitors.
Figure 2:
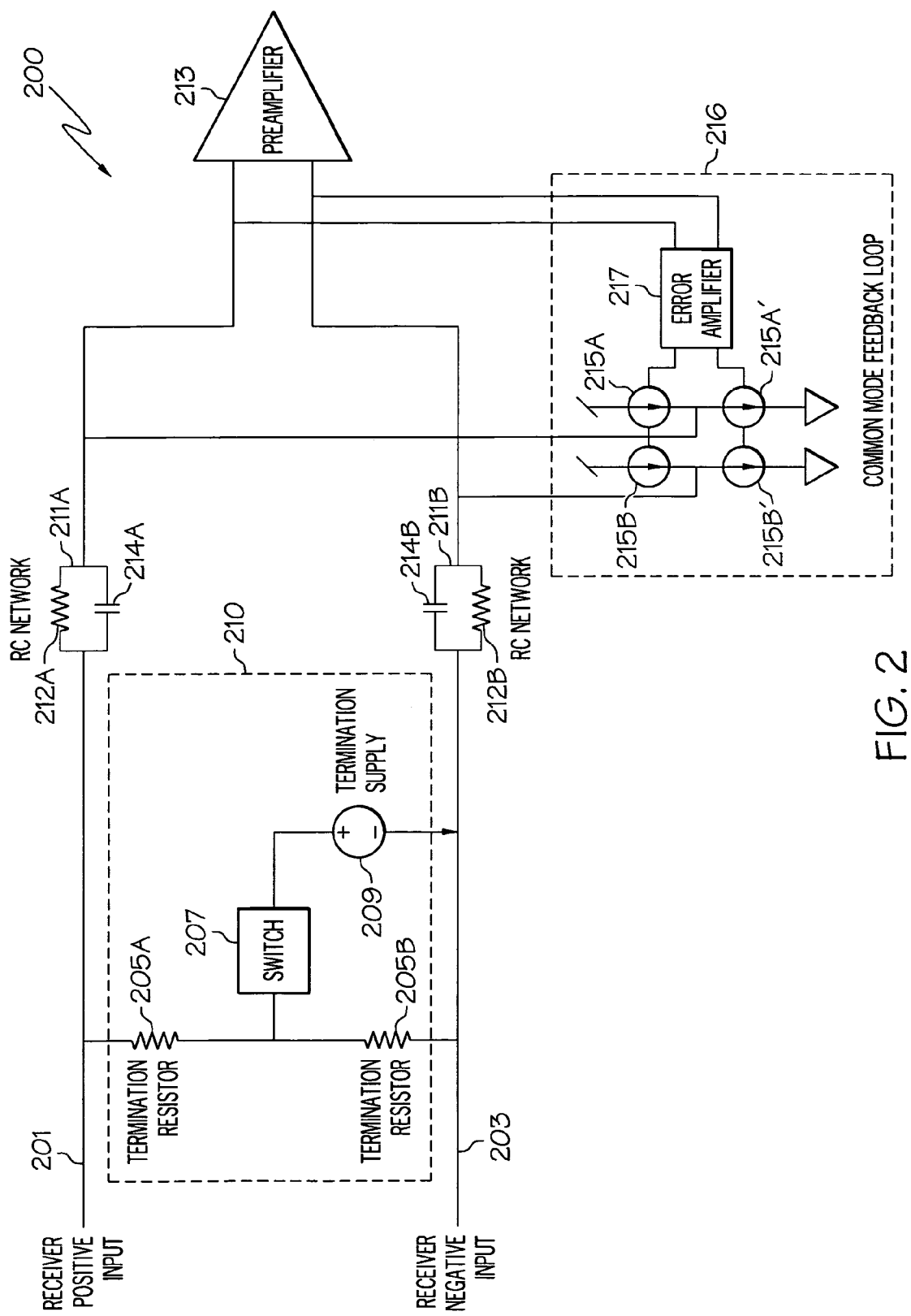
FIG. 2 is a circuit diagram of an HSS link receiver designed to accommodate wide rages of input voltage in accordance with one embodiment of the invention.

With reference now to the figures and in particular to FIG. 2, wherein is illustrated an example architecture of the HSS link receiver circuit designed according to the invention. The HSS link receiver 200 comprises four primary components: termination components 210; two resistor-capacitor (RC) networks 211A, 211B; a feedback loop 216; and the receiver preamplifier 213.

As illustrated, the HSS link receiver 200 has dual inputs, positive input 201 and negative input 203. Termination components 210 bridge these two inputs via two resistive elements, termination resistors 205. Termination supply 209 is connected to the node in between termination resistors 205 via a switch 207. RC networks 211A and 211B are in turn, respectively coupled to positive input 201 and negative input 203. Each RC network 211A/211B comprises a resistor 212A/B coupled in parallel to a capacitor 214A/B. RC networks 211A and 211B then provide inputs to receiver preamplifier 213. These inputs are also applied to common mode feedback loop 216.

Common mode feedback loop 216 is utilized to monitor the shifted common-mode voltage and comprises error amplifier 217 and a pair of pull-up current sources 215A/215B and pull-down current sources 215A'/215B'. Error amplifier 217 is coupled to the inputs of preamplifier 213 and receives, as its input signals, the pair of signals being sent from RC networks 211A/211B to preamplifier 213. Error amplifier 217 outputs a corresponding pair of signals to respective series-connected pull-up/pull down current sources 215A/A' and 215B/B'. These current sources 215A/B or 215A'/B' in turn provide the feedback signal to the signal lines of RC networks 211A, 211B.

The size of the input voltage at the termination supply 209 is determined by the customer/end user of the device and is therefore variable. Also, the preamplifier 213 is powered by the chip's device voltage ($V_{DD}$). For normal operation, the error amplifier 217 in the feedback loop 216 monitors the common mode voltage at the input of the preamplifier 213 and adjusts the strength of the current sources 215A/A' and 215B/B' to create a net current which is sourced into or sunk from the termination supply 209. The feedback loop may automatically determine whether a source or sink current is needed to achieve the desired common mode voltage. In one embodiment, only one current source (pull up 215A/215B or 215A'/215B') is "on" at a time, depending on whether the voltage detected at the input of the preamplifier 213 needs to be adjusted/pulled up or adjusted/pulled down.

This direct current (DC-current) from the feedback loop flows through the resistor 212A/B of the RC networks 211A, 211B. The resistors 212A/B exhibit a high impedance compared to the termination resistors 205A/B, and the DC-current thus creates a voltage drop across the RC networks 211A/211B. The voltage drop across the RC networks 211A/211B therefore raises or lowers the input common mode voltage, as needed. The capacitor 214 in parallel with the resistor 212A/B in the RC network 211A/211B couples the at-speed signal around the resistor 212A/B, therefore preserving the amplitude of the at-speed signal and preventing the attenuation that would be caused if the signal traveled through the resistor 212A/B. Once the feedback loop 216 has made this adjustment, the signal at the input of the preamplifier 213 is at the desired optimal common mode voltage.

The current in the output of the feedback loop 216 is sized so that the common mode voltage may be shifted a sufficient amount to prevent an over-voltage condition at the preamplifier input. Since the feedback loop 216 constantly monitors the common mode voltage, any common mode noise is removed up to the bandwidth limit of the loop 216.

With the above design/configuration, HSS receiver 200 exhibits several following improved characteristics, including, for example:

(1) the receiver 200 tolerates wide ranges of termination voltages even when the receiver is not itself powered. The supply voltage may be set to whatever the end user desires and the feedback loop is designed to adjust to accommodate for the variations in the termination supply; (2) the receiver 200 interoperates with other receiver components powered by the chip's $V_{DD}$; (3) the receiver presents a high common mode impedance whenever the switch 207 is turned off; (4) the receiver 200 functions similarly over all signaling rates and transition densities by providing both a DC path through resistors 212A/B to track DC currents and an AC path through capacitors 214A/B to track the AC currents; (5) power consumption of the receiver 200 is minimized since the feedback loop adds only small amounts of current, resulting in very minimal shifting of current through the resistors 212A/B; (6) the required area of the receiver is minimized due to the utilization of a substantially smaller capacitors and relatively small feedback loop components; (7) the receiver rejects common mode noise due to the bandwidth of the feedback loop, affecting the differential amplifier inputs; and (8) the receiver operates at an optimal common mode voltage as the feedback loop regulates the actual voltage supplied at the termination supply. In one embodiment, the designer of the receiver may supply a common mode point (e.g., $\frac{1}{2} V_{VDD}$ or $\frac{3}{4} V_{DD}$) as a reference voltage for the error amplifier to utilize in regulating the common mode voltage.

While the invention has been particularly shown and described with reference to a preferred embodiment, it will be understood by those skilled in the art that various changes in form and detail may be made therein without departing from the spirit and scope of the invention.

What is claimed is:

1. A circuit device comprising:
   a pair of input terminals at which a positive and a negative inputs are received;
   a termination circuit bridging the pair of input terminals;
   a pair of resistor-capacitor (RC) networks coupled to respective ones of the input terminals;
   a preamplifier with a pair of input terminals coupled via signal paths to respective output terminals of the pair of RC networks; and
   a common mode feedback loop with two inputs coupled to respective input terminals of the preamplifier and two outputs coupled to the respective output signal lines of the RC networks.

2. The circuit device of claim 1, wherein the termination circuit comprises:
   a termination supply;
   a pair of resistors connected at one end to a connecting node and at the respective other ends to a positive input path and a negative input path;
   a switch connected between the termination supply and the connecting node.

3. The circuit device of claim 1, wherein the RC networks comprise:

a resistor; and
a parallel-connected capacitor;
wherein the resistor provides a path for propagation of direct current and the capacitor provides a path for propagation of alternating current.

4. The circuit device of claim 1, wherein the common mode feedback loop comprises:
an error amplifier to which the two inputs are provided and which comprises a pair of output terminals;
two combinations of a pull-up current source series-connected to a pull-down current source, each of said pull-up current source and said pull-down current source respectively coupled to one of the pair of output terminals of the error amplifier;
wherein a second connecting node between each combination of the pull-up current source and the pull-down current source is respectively coupled to the signal lines of the RC networks to provide a feedback signal to the RC networks.

5. The circuit device of claim 4, wherein further:
the error amplifier monitors the common mode voltage at the input of the preamplifier; and when a measured common mode voltage is not a desired, established common mode voltage, the amplifier triggers one of the current sources within the two combinations of current sources to turn on and provide a measured feedback current to adjust the measured common mode voltage in the direction of the desired, established common mode voltage.

6. The circuit device of claim 2, wherein:
the termination supply is a variable input termination supply; and
the preamplifier is powered by a device voltage ($V_{DD}$).

7. The circuit device of claim 1, wherein the device is fabricated on a chip.

8. A method for fabricating a chip with a serial link receiver designed according to claim 3.

9. A serial link receiver configured according to claim 4.

10. A serial link receiver comprising:
a pair of input terminals at which a positive and a negative inputs are received;
a termination circuit bridging the pair of input terminals;
a pair of resistor-capacitor (RC) networks coupled to respective ones of the input terminals;
a preamplifier with a pair of input terminals coupled via signal paths to respective output terminals of the pair of RC networks; and
a common mode feedback loop with two inputs coupled to respective input terminals of the preamplifier and two outputs coupled to the respective output signal lines of the RC networks.

11. The serial link receiver of claim 10, wherein the termination circuit comprises:
a termination supply;
a pair of resistors connected at one end to a connecting node and at the respective other ends to a positive input path and a negative input path;
a switch connected between the termination supply and the connecting node.

12. The serial link receiver of claim 10, wherein the RC networks comprise:
a resistor; and
a parallel-connected capacitor;
wherein the resistor provides a path for propagation of direct current and the capacitor provides a path for propagation of alternating current.

13. The serial link receiver of claim 10, wherein the common mode feedback loop comprises:
an error amplifier to which the two inputs are provided and which comprises a pair of output terminals;
two combinations of a pull-up current source series-connected to a pull-down current source, each of said pull-up current source and said pull-down current source respectively coupled to one of the pair of output terminals of the error amplifier;
wherein a second connecting node between each combination of the pull-up current source and the pull-down current source is respectively coupled to the signal lines of the RC networks to provide a feedback signal to the RC networks.

14. The serial link receiver of claim 13, wherein further:
the error amplifier monitors the common mode voltage at the input of the preamplifier; and when a measured common mode voltage is not a desired, established common mode voltage, the amplifier triggers one of the current sources within the two combinations of current sources to turn on and provide a measured feedback current to adjust the measured common mode voltage in the direction of the desired, established common mode voltage.

15. The serial link receiver of claim 11, wherein:
the termination supply is a variable input termination supply; and
the preamplifier is powered by a device voltage ($V_{DD}$).

16. A method for improving power characteristics of a serial link receiver, said method comprising:
adding an RC network inline with both a positive and negative receiver inputs, wherein said RC network comprises parallel-connected resistor and capacitor;
coupling the output signal lines of each RC network to the input terminals of a receiver amplifier; and
coupling between the input terminals and the output signal lines of the RC network a common mode feedback loop comprising:
an error amplifier to which the two inputs are provided and which comprises a pair of output terminals;
two combinations of a pull-up current source series-connected to a pull-down current source, each of said pull-up current source and said pull-down current source respectively coupled to one of the pair of output terminals of the error amplifier;
wherein a second connecting node between each combination of the pull-up current source and the pull-down current source is respectively coupled to the signal lines of the RC networks to provide a feedback signal to the RC networks.

* * * * *